United States Patent
Kuan et al.

(10) Patent No.: US 9,705,020 B2
(45) Date of Patent: Jul. 11, 2017

(54) SHEET AND MODULE STRUCTURE

(71) Applicant: INDUSTRIAL TECHNOLOGY RESEARCH INSTITUTE, Hsinchu (TW)

(72) Inventors: Min-Tsung Kuan, Taichung (TW); Pei-Ying Yang, Taipei (TW); Wen-Hsien Wang, Tainan (TW); Wen-Hsien Chou, Lunbei Township (TW); Wen-Kuei Lee, Puyan Township (TW); Han-Chang Liu, Tongluo Township (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 14/833,866

(22) Filed: Aug. 24, 2015

(65) Prior Publication Data
US 2016/0247952 A1    Aug. 25, 2016

(30) Foreign Application Priority Data

Oct. 3, 2014 (TW) .............................. 103134516 A
Jun. 30, 2015 (TW) .............................. 104121065 A

(51) Int. Cl.
*H01L 31/042* (2014.01)
*H02N 6/00* (2006.01)
(Continued)

(52) U.S. Cl.
CPC ............ *H01L 31/0481* (2013.01); *B32B 7/04* (2013.01); *B32B 17/064* (2013.01); *B32B 25/08* (2013.01);
(Continued)

(58) Field of Classification Search
CPC ... H01L 31/0481; H01L 31/049; B32B 27/20; B32B 27/32; B32B 27/08; B32B 27/34;
(Continued)

(56) References Cited

U.S. PATENT DOCUMENTS 5,291,036 A    3/1994    Tran et al.
5,420,452 A    5/1995    Tran et al.
(Continued)

FOREIGN PATENT DOCUMENTS

CN    1910043 A    2/2007
CN    102197085 A    9/2011
(Continued)

OTHER PUBLICATIONS

Chinese Office Action for Appl. No. 201510440072.2 dated Sep. 19, 2016.

*Primary Examiner* — Luan Van
*Assistant Examiner* — Angelo Trivisonno
(74) *Attorney, Agent, or Firm* — Birch, Stewart, Kolasch & Birch, LLP

(57) ABSTRACT

A module structure is provided, which includes a front sheet, a back sheet opposite the front sheet, and a solar cell disposed between the front sheet and the back sheet. A first encapsulate film is disposed between the solar cell and the front sheet, and a second encapsulate film disposed between the solar cell and the back sheet. One or both of the front sheet and the second sheet includes a support layer and a light conversion layer on the support layer, wherein the light conversion layer includes a fluorescent molecule and hydrogenated styrene elastomer resin. The light conversion layer is disposed between the support layer and the solar cell.

11 Claims, 1 Drawing Sheet

(51) Int. Cl.
*H01L 31/048* (2014.01)
*H01L 31/049* (2014.01)
*B32B 27/20* (2006.01)
*B32B 27/32* (2006.01)
*B32B 17/06* (2006.01)
*B32B 27/34* (2006.01)
*B32B 27/08* (2006.01)
*B32B 7/04* (2006.01)
*B32B 25/08* (2006.01)
*B32B 27/30* (2006.01)

(52) U.S. Cl.
CPC .............. *B32B 27/08* (2013.01); *B32B 27/20* (2013.01); *B32B 27/302* (2013.01); *B32B 27/306* (2013.01); *B32B 27/32* (2013.01); *B32B 27/325* (2013.01); *B32B 27/34* (2013.01); *H01L 31/049* (2014.12); *B32B 2264/00* (2013.01); *B32B 2270/00* (2013.01); *B32B 2274/00* (2013.01); *B32B 2307/412* (2013.01); *B32B 2307/422* (2013.01); *B32B 2307/732* (2013.01); *B32B 2457/12* (2013.01); *Y02E 10/52* (2013.01)

(58) Field of Classification Search
CPC . B32B 27/325; B32B 17/064; B32B 2264/00; B32B 2457/12; B32B 2307/422
See application file for complete search history.

(56) References Cited

U.S. PATENT DOCUMENTS

| | | | |
|---|---|---|---|
| 6,180,991 B1 | 1/2001 | Yamazaki | |
| 6,700,057 B2 | 3/2004 | Yasuno | |
| 8,076,581 B2 | 12/2011 | Schmidt | |
| 8,163,581 B1 | 4/2012 | Or-Bach et al. | |
| 8,358,059 B2 | 1/2013 | Huang et al. | |
| 8,399,768 B2 | 3/2013 | Schmidt | |
| 8,465,675 B2 | 6/2013 | Kuan et al. | |
| 8,486,299 B2 | 7/2013 | Huang et al. | |
| 2003/0015234 A1 | 1/2003 | Yasuno | |
| 2007/0295383 A1 | 12/2007 | Li et al. | |
| 2010/0084634 A1 | 4/2010 | Gamo et al. | |
| 2010/0132789 A1 | 6/2010 | Huang et al. | |
| 2010/0133987 A1 | 6/2010 | Huang et al. | |
| 2010/0258162 A1 | 10/2010 | O'Brien et al. | |
| 2010/0307822 A1 | 12/2010 | Schmidt | |
| 2011/0015610 A1 | 1/2011 | Plahey et al. | |
| 2011/0203643 A1* | 8/2011 | Watanabe | H01L 31/048 136/251 |
| 2011/0226314 A1 | 9/2011 | Huang et al. | |
| 2011/0253942 A1* | 10/2011 | Kuan | C09K 11/06 252/301.35 |
| 2012/0048353 A1 | 3/2012 | Woo et al. | |
| 2012/0167983 A1 | 7/2012 | Cho et al. | |
| 2013/0078460 A1 | 3/2013 | Tasaka et al. | |
| 2013/0206211 A1 | 8/2013 | Li et al. | |
| 2013/0206448 A1 | 8/2013 | Schmidt | |
| 2014/0007918 A1* | 1/2014 | Lee | H01L 31/0527 136/246 |
| 2014/0144488 A1* | 5/2014 | Okuyama | B32B 27/08 136/251 |

FOREIGN PATENT DOCUMENTS

| | | |
|---|---|---|
| CN | 102216378 A | 10/2011 |
| CN | 102250404 A | 11/2011 |
| CN | 102696127 A | 9/2012 |
| CN | 103183971 A | 7/2013 |
| CN | 103635524 A | 3/2014 |
| CN | 103650161 A | 3/2014 |
| CN | 103840023 A | 6/2014 |
| JP | 2013-84872 A | 5/2013 |
| TW | 200538512 A | 12/2005 |
| TW | 200606209 | 2/2006 |
| TW | 200606210 | 2/2006 |
| TW | I268949 B | 12/2006 |
| TW | 200901112 A | 1/2009 |
| TW | I365897 | 6/2012 |
| TW | I379866 B | 12/2012 |
| TW | 201309783 A | 3/2013 |
| TW | I366588 | 7/2013 |
| TW | I401291 B | 7/2013 |
| TW | 201421713 A | 6/2014 |
| WO | WO 2011/048895 A1 | 4/2011 |

* cited by examiner

SHEET AND MODULE STRUCTURE

CROSS REFERENCE TO RELATED APPLICATIONS

The present application is based on, and claims priority from, Taiwan Application Serial Number 104121065, filed Jun. 30, 2015, and Taiwan Application Serial Number 103134516, filed on Oct. 3, 2014, the disclosure of which are hereby incorporated by reference herein in its entirety

TECHNICAL FIELD

The technical field relates to a solar cell module structure, and in particular it relates to a structure and compositions of a sheet serving as a front sheet or a back sheet in the solar cell module structure.

BACKGROUND

In a conventional crystalline silicon solar cell module, a mono-facial cell is selected for a module package. However, the above cell module is easily limited by landscapes and ground objects, thereby resulting in problems such as low power generation, low efficiency, and high cost. A novel cell module for a bifacial cell has been developed thanks to battery plate improvements. The module of the battery plate is becoming a desirable product in this industry because it may enhance the efficiency of power generation and reduce the cost of installation.

The package module of the bifacial cell is still formed by the traditional package method, in which a front sheet such as glass, an encapsulant such as ethylene vinyl acetate copolymers (EVA), a bifacial solar cell, another encapsulant such as EVA, and a back sheet such as glass are arranged from top to bottom. The encapsulant functions include fixing the solar cell, connecting the circuit line, and providing insulation protection for the solar cell. In addition, the cell performance should overcome the surrounding test even after long-term use through the encapsulant. The back sheet may provide electrical insulation, water resistance, high temperature resistance, and high moisture resistance to lengthen the lifetime of the solar cell module.

The module for the bifacial cell should adopt a transparent glass or a transparent back sheet to meet the requirements of power generation from the back-side exposure in practice. However, the glass may increase the total cost of the module system due to its weight. As a result, glass cannot be widely used. The plastic substrate may simultaneously have the following properties: high light transmittance, high water and gas proofing, and excellent climate resistance. Moreover, whatever material is selected for the back sheet, it should have an excellent adhesion in the module, as well as be able to protect the cell.

SUMMARY

One embodiment of the disclosure provides a sheet, comprising: a support layer; and a light conversion layer disposed on the support layer, wherein the light conversion layer includes a fluorescent molecule and a hydrogenated styrene elastomer resin.

One embodiment of the disclosure provides a module structure, comprising: a front sheet; a back sheet opposite the front sheet; a solar cell disposed between the front sheet and the back sheet; a first encapsulating film disposed between the solar cell and the front sheet; and a second encapsulating film disposed between the solar cell and the back sheet. One or both of the front sheet and the back sheet is the sheet described above, and the light conversion layer is disposed between the support layer and the solar cell.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

Figure 1:
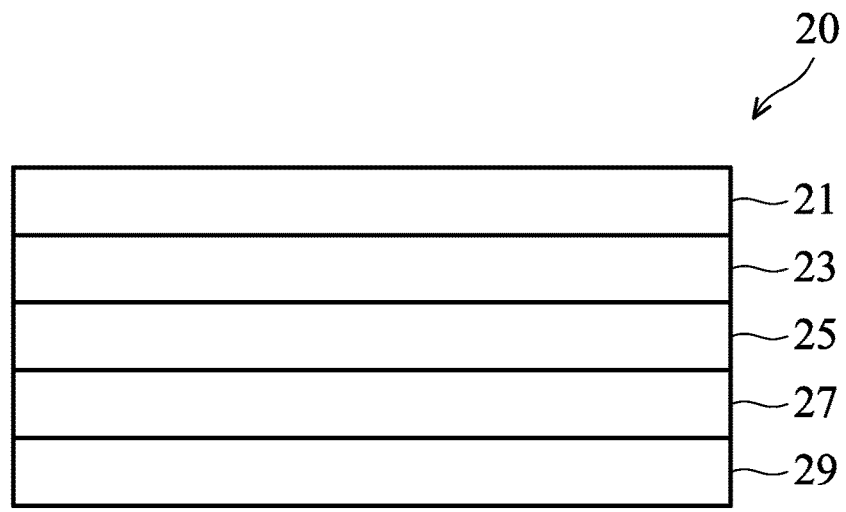
FIG. 1 shows a solar cell module in one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are shown schematically in order to simplify the drawing.

In one embodiment of the disclosure, a sheet can be applied in a module of solar cell, as shown in FIG. 1. The module structure 20 includes a front sheet 21, a back sheet 29, and a solar cell 25. The solar cell 25 is disposed between the front sheet 21 and the back sheet 29. An encapsulation film 23 is disposed between the solar cell 25 and the front sheet 21. An encapsulation film 27 is disposed between the solar cell 25 and the back sheet 29. The encapsulation films 23 and 27 can be ethylene-vinyl acetate copolymer (EVA). In the module structure 20 of FIG. 1, one or both of the front sheet 21 and the back sheet 29 is the sheet of the disclosure. For example, when the solar cell is a mono-facial solar cell (with only one side exposed to light), the light only enters the solar cell through the back sheet 21, so the front sheet 21 is the sheet of the disclosure and the back sheet 29 can be a transparent material such as glass, ethylene tetrafluoroethylene (ETFE), polyacrylate, the back sheet structure of polyolefin and hydrogenated polystyrene elastomer resin in the module structure of Taiwan Patent Application No. TW101143193, or the like. When the solar cell 25 is a bifacial solar cell (with both sides exposed to light), the light enters the solar cell through the front sheet 21 and the back sheet 29, so both the front sheet 21 and the back sheet 29 are sheets of the disclosure.

Figure 2:
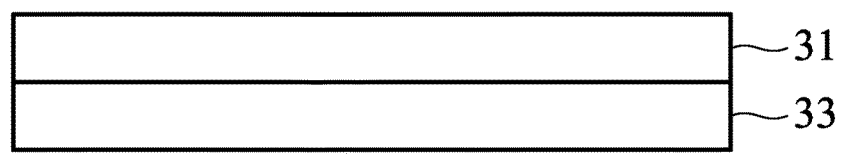
FIG. 2 shows a sheet in one embodiment of the disclosure.

In one embodiment, the sheet for the front sheet 21 or the back sheet 29 is a bi-layered structure of the support 31 and the light conversion layer 33, as shown in FIG. 2. When the front sheet 21 (or the back sheet 29) is the sheet, the light conversion layer 33 is disposed between the support layer 31 and the solar cell 25. The support layer 31 should have high light transmittance. In one embodiment, the support layer 31 is glass or polyolefin such as linear olefin polymer, cyclic olefin polymer, or polyamide. The linear olefin polymer can be polyethylene, polypropylene, ethylene-propylene copolymer, or methyl methacrylate-styrene copolymer. The cyclic olefin polymer includes ethylene propylene diene monomer rubber. For reducing the weight of the module structure 20, the support layer 31 can be polyolefin. The molecular weight and melt index of the polyolefin have a negative correlation. A higher melt index means a lower molecular weight. For example, the polyolefin with a lower melt index has a higher molecular weight. In one embodiment, the polyolefin has a melt index of about 1.0 g/10 min to 8.0 g/10 min. The polyolefin with an overly low melt index may have flowability which is too low to form a film with a uniform thickness. The polyolefin with an overly high melt index may have flowability which is too high for separation from other films, and it may mix with the other films.

The light conversion layer 33 includes fluorescent and hydrogenated styrene elastomer resin. The light conversion layer 33 should have properties such as high light transmittance, low water absorption, insulation, and the like. The fluorescent molecule may convert the UV light in the incident light to visible light to further enhance the efficiency of the solar cell. In one embodiment, the fluorescent molecule has a structure of Formula 1:

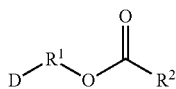

(Formula 1)

In Formula 1, D is anthranyl, carbazolyl, or pyrenyl; $R^1$ is $C_{1-4}$ alkylene group; and $R^2$ is $C_{12-18}$ alkyl group. $R^1$ with an overly high carbon number may influence the reactivity and product yield of the synthesis for the fluorescent molecule. $R^2$ with an overly low carbon number may make an overly large polarity difference between the fluorescent molecule and the hydrogenated styrene elastomer resin, thereby failing to efficiently decrease the haze of the light conversion layer 33. $R^2$ with an overly high carbon number cannot further reduce the haze of the light conversion layer 33, but increase the cost of manufacturing the light conversion layer 33 due to an overly low synthesis yield of the fluorescent molecule.

In one embodiment, the hydrogenated styrene elastomer resin can be hydrogenated poly(styrene-b-isoprene), hydrogenated poly(styrene-b-isoprene-b-styrene, hydrogenated poly(styrene-b-butadiene-b-styrene), hydrogenated poly(styrene-b-isoprene/butadiene-b-styrene, hydrogenated poly(styrene-b-vinyl bonded rich polyisoprene), or a combination thereof. The hydrogenated styrene elastomer resin contains about 10 wt % to 35 wt % of a polystyrene block. In one embodiment, the hydrogenated styrene elastomer resin contains about 12 wt % to 20 wt % of a polystyrene block. An overly low polystyrene block ratio may degrade the hardness and the mechanical tensile strength of the copolymer. An overly high polystyrene block ratio may improve the hardness and the mechanical tensile strength of the copolymer, however, the flowability and the related processability of the copolymer is lowered, and the glass transfer temperature (Tg) of the copolymer is increased to reduce the adhesive property of the copolymer. The molecular weight and melt index of the hydrogenated styrene elastomer resin have a negative correlation. In short, a higher melt index means a lower molecular weight. For example, the hydrogenated styrene elastomer resin with a lower melt index has a higher molecular weight. In one embodiment, the hydrogenated styrene elastomer resin has a melt index of about 1.0 g/10 min to 8.0 g/10 min, or of about 3.5 g/10 min to 6.5 g/10 min. The hydrogenated styrene elastomer resin with an overly low melt index may have flowability which is too low to form a film with a uniform thickness. The hydrogenated styrene elastomer resin with an overly high melt index may have flowability which is too high for separation from other films, and it may mix with the other films.

In the light conversion layer 33, the fluorescent molecule and the hydrogenated styrene elastomer resin have a weight ratio of 1:199 to 1:4. The appropriate amount of the fluorescent molecule may efficiently reduce the haze of the hydrogenated styrene elastomer resin. For example, an extruded film of a hydrogenated styrene elastomer resin S1611 (commercially available from Asahi Chemical Co. Ltd.) has a haze of 20, and an extruded film of the hydrogenated styrene elastomer resin S1611 and a fluorescent molecule (e.g. the product in Synthesis Example 3) has a haze of 3. An overly low ratio of the fluorescent molecule cannot efficiently decrease the haze of the light conversion layer 33. Moreover, the amount of UV light converted to visible light is insufficient due to the overly low ratio of the fluorescent molecule. An overly high ratio of the fluorescent molecule cannot further enhance the amount of UV light converted to visible light, but increases the cost of the light conversion layer 33.

In one embodiment, the sheet has a thickness of 0.3 mm to 1 mm. A sheet that is too thin may degrade the solar cell 25 of the module structure 20 due to moisture. A sheet that is too thick will increase the cost and the weight of the module structure. In one embodiment, the light conversion layer 33 and the support layer 31 have a thickness ratio of about 1:1 to 1:10, or about 1:3 to 1:5. An overly thin light conversion layer 33 cannot efficiently enhance the amount of UV light converted to visible light. Moreover, the support layer 31 cannot be easily adhered to the encapsulation film 23 or 27 due to the overly thin light conversion layer 33. While the sheet thickness is a constant, an overly thick light conversion layer 33 will reduce the thickness of the support layer, thereby failing to efficiently protect the solar cell 25.

In one embodiment, dye, anti-oxidant, or a combination can be added into the support layer 31 or the light conversion layer of the sheet. A dye such as carbon black or pigment masterbatch (e.g. polyolefin pigment masterbatch CLARIANT REMAFIN) may change the appearance color of the module structure to match the building style. The anti-oxidant such as dibutyl hydroxy toluene (BHT), bis(2,2,6,6-tetramethyl-4-piperidyl)sebacate, benzophenone, a derivative thereof, or a combination thereof may prevent the hydrogenated styrene elastomer resin and/or the polyolefin layer from yellowing. In general, the additive occupies less than about 10 wt % of the support layer 31 (or the light conversion layer 33), between about 0.1 wt % to 10 wt % of the support layer 31 (or the light conversion layer 33), or between about 5 wt % to 10 wt % of the support layer 31 (or the light conversion layer 33). Adding too much of the additive may damage the processability of the support layer 31 (or the light conversion layer 33).

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

EXAMPLES

Synthesis Example 1

10.563 g of carbazole-N-ethanol (0.05 mole, molecular weight=211.26, purity=98%, commercially available from Japan Distillation), 10 g of toluene, and 5,639 g of pyridine were put into a reaction bottle (100 mL) and stirred to form a pale yellow solution. 15.146 g of stearoyl chloride (0.05 mmole, molecular weight=302.92, purity=98%, commercially available from TCI) was slowly flushed into the pale yellow solution by 10 g of toluene, and the mixture in the reaction bottle was then continuously reacted for about 5 hours until the color of the reaction was brown with precipitate. The reaction result was filtered, and filtered cake was washed by toluene to collect the filtrate. The filtrate was concentrated under reduced pressure to obtain a white crude (yield=83%). The above reaction is shown in Formula 2. The crude was dissolved by acetone and then re-crystallized to obtain a white powder product. The product had a melting point of 67.0° C. to 68.1° C. The $^1$H NMR (200 MHz, CDCl$_3$, ppm) spectrum of the product is listed below: 0.87-1.56 (t, 35H), 2.17 (t, 2H), 4.42 (t, 2H), 4.58 (t, 2H), 7.2-8.1 (m, 8H).

(Formula 2)

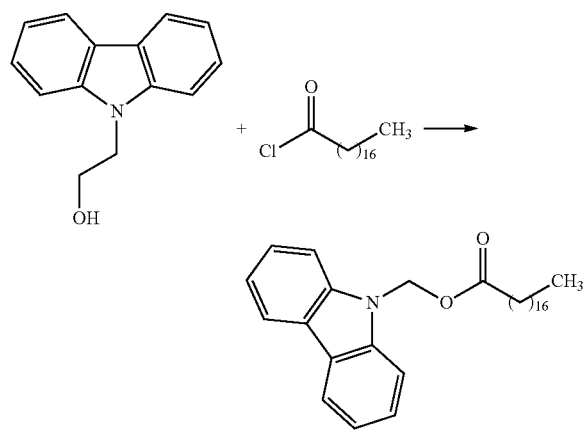

Synthesis Example 2

Synthesis Example 2 was similar to Synthesis Example 1, and the difference in Synthesis Example 2 was 10.563 g of carbazole-N-ethanol being replaced with 10.412 g of 9-anthracenemethanol (0.05 mole, molecular weight=208.255, purity=98%, commercially available from Japan Distillation). The types and amounts of the other reactants and the solvent in Synthesis Example 2 were similar to that of Synthesis Example 1. The reaction is shown in Formula 3. The crude was dissolved by acetone and re-crystallized to obtain a yellow crystal product. The product had a melting point of 74.3° C. to 74.9° C. The $^1$H NMR (200 MHz, CDCl$_3$, ppm) spectrum of the product is listed below: 0.89 (t, 3H), 1.25-1.6 (m, 32H), 2.35 (t, 2H), 6.15 (s, 2H), 7.4-8.4 (m, 9H).

(Formula 3)

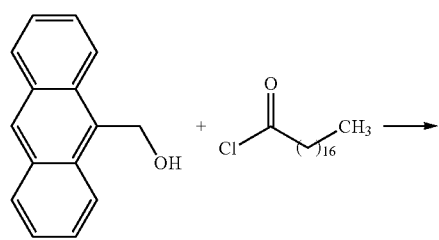

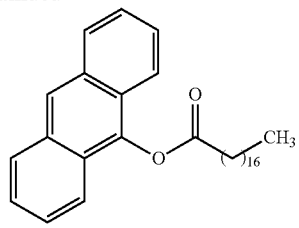

Synthesis Example 3

Synthesis Example 3 was similar to Synthesis Example 1, and the difference in Synthesis Example 3 was 15.146 g of stearoyl chloride being replaced with 13.744 g of palmitoyl chloride (0.05 mole, molecular weight=274.87, purity=98%, commercially available from ACROS). The types and amounts of the other reactants and the solvent in Synthesis Example 3 were similar to that of Synthesis Example 1. The reaction is shown in Formula 4. The crude was dissolved by acetone and re-crystallized to obtain a white powder product. The product had a melting point of 62.1° C. to 62.8° C. The $^1$H NMR (200 MHz, CDCl$_3$, ppm) spectrum of the product is listed below: 0.87-1.56 (t, 29H), 2.17 (t, 2H), 4.42 (t, 2H), 4.58 (t, 2H), 7.2-8.1 (m, 8H).

(Formula 4)

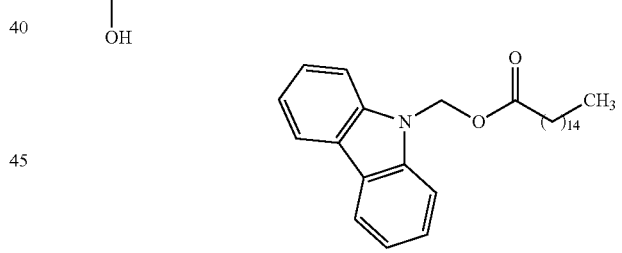

Synthesis Example 4

Synthesis Example 4 was similar to Synthesis Example 1, and the differences in Synthesis Example 4 were 10.563 g of carbazole-N-ethanol being replaced with 10.412 g of 9-anthracenemethanol, and 15.146 g of stearoyl chloride being replaced with 13.744 g of palmitoyl chloride. The types and amounts of the other reactants and the solvent in Synthesis Example 4 were similar to that of Synthesis Example 1. The reaction is shown in Formula 5. The crude was dissolved by acetone and re-crystallized to obtain a yellow crystal product. The product had a melting point of 67.4° C. to 68.8° C. The $^1$H NMR (200 MHz, CDCl$_3$, ppm) spectrum of the product is listed below: 0.89-1.7 (m, 29H), 2.3 (t, 2H), 6.1 (s, 2H), 7.4-8.4 (m, 9H).

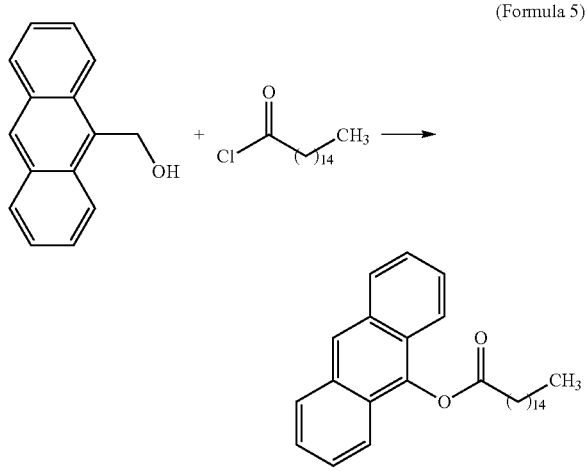

(Formula 5)

Synthesis Example 5

Synthesis Example 5 was similar to Synthesis Example 1, and the differences in Synthesis Example 5 was 15.146 g of stearoyl chloride being replaced with 10.938 g of dodecanoyl chloride (0.05 mole, molecular weight=218.76, purity=98%, commercially available from TCI). The types and amounts of the other reactants and the solvent in Synthesis Example 5 were similar to that of Synthesis Example 1. The reaction is shown in Formula 6. The crude was dissolved by acetone and re-crystallized to obtain a white powder product. The product had a melting point of 49.0° C. to 50.7° C. The $^1$H NMR (200 MHz, CDCl$_3$, ppm) spectrum of the product is listed below: 0.87-1.56 (t, 21H), 2.17 (t, 2H), 4.42 (t, 2H), 4.58 (t, 2H), 7.2-8.1 (m, 8H).

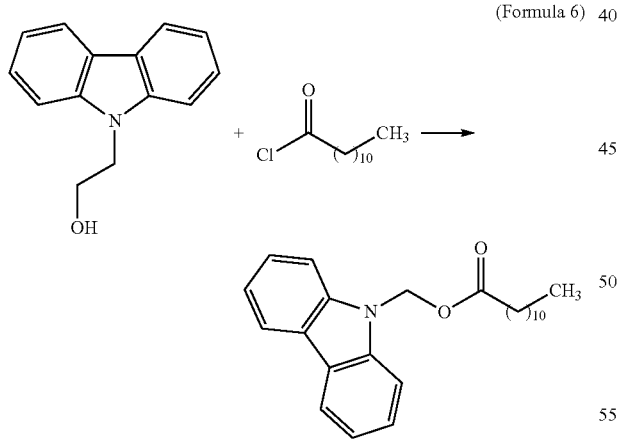

(Formula 6)

Synthesis Example 6

Synthesis Example 6 was similar to Synthesis Example 1, and the differences in Synthesis Example 6 were 10.563 g of carbazole-N-ethanol being replaced with 10.412 g of 9-anthracenemethanol, and 15.146 g of stearoyl chloride being replaced with 10.938 g of dodecanoyl chloride. The types and amounts of the other reactants and the solvent in Synthesis Example 6 were similar to that of Synthesis Example 1. The reaction is shown in Formula 7. The crude was dissolved by acetone and re-crystallized to obtain a pale yellow crystal powder product. The product had a melting point of 53.8° C. to 54.8° C. The $^1$H NMR (200 MHz, CDCl$_3$, ppm) spectrum of the product is listed below: 0.9-1.6 (m, 21H), 2.2 (t, 2H), 5.9 (s, 2H), 7.3-8.3 (m, 9H).

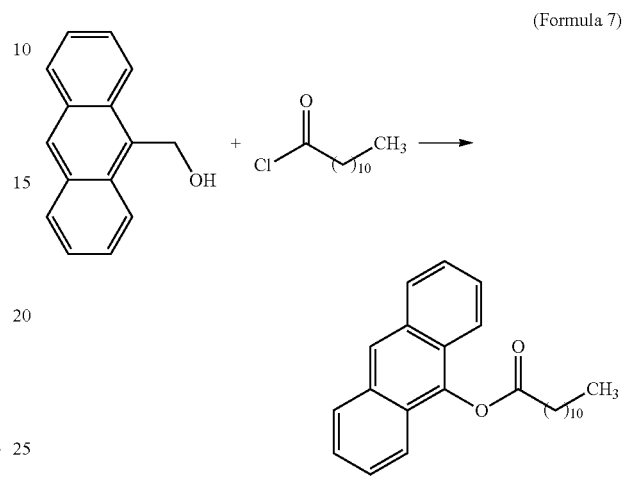

(Formula 7)

Example 1

100 kg of hydrogenated styrene elastomer resin S1611 (commercially available from Asahi Chemical Co. Ltd.) and 0.6 kg of the fluorescent molecule product in Synthesis Example 3 were put into a twin-screw extruder HP-50 (commercially available from GANG LING MACHINERY CO., LTD.), pre-heated to 150° C. and maintained at 150° C. for 10 minutes, and then pressed at 150° C. by a pressure of 100 kg/cm$^2$ for 10 minutes to form a film as a light conversion layer.

A methyl methacrylate-styrene copolymer PM-600 (commercially available from Chi Mei Cooperation) was selected as a support layer material, put into the extruder HP-50 (commercially available from GANG LING MACHINERY CO., LTD.), pre-heated to 180° C. and maintained at 180° C. for 10 minutes, and then pressed at 180° C. by a pressure of 100 kg/cm$^2$ for 10 minutes to form a film as the support layer. The light conversion layer and the support layer were co-extruded to form a bi-layered sheet, and the physical properties of the sheet are listed in Table 1-1.

Example 2

100 kg of hydrogenated styrene elastomer resin S1611 (commercially available from Asahi Chemical Co. Ltd.) and 1 kg of the fluorescent molecule product in Synthesis Example 3 were put into a single-screw extruder FRP-V32C (commercially available from MEISEI KINZOKU MFG. CO., LTD., Japan) to be pelletized as a light conversion layer material. The temperature of the extruder was separated to four segments: 130° C., 140° C., 140° C., and 130° C. The pellets were put into the extruder HP-50 (GANG LING MACHINERY CO., LTD.), pre-heated to 150° C. and maintained at 150° C. for 10 minutes, and then pressed at 150° C. by a pressure of 100 kg/cm$^2$ for 10 minutes to form a film as a light conversion layer.

The methyl methacrylate-styrene copolymer PM-600 (commercially available from Chi Mei Cooperation) was selected as a support layer material, put into the extruder HP-50 (commercially available from GANG LING MACHINERY CO., LTD.), pre-heated to 180° C. and maintained at 180° C. for 10 minutes, and then pressed at 180° C. by a pressure of 100 kg/cm$^2$ for 10 minutes to form a film as the support layer. The light conversion layer and the support layer were co-extruded to form a bi-layered sheet, and the physical properties of the sheet are listed in Table 1-1.

Example 3

100 kg of hydrogenated styrene elastomer resin S1611 (commercially available from Asahi Chemical Co. Ltd.) and 0.6 kg of the fluorescent molecule product in Synthesis Example 3 were put into the single-screw extruder FRP-V32C (commercially available from MEISEI KINZOKU MFG. CO., LTD., Japan) to be pelletized as a light conversion layer material. The temperature of the extruder was separated to four segments: 130° C., 140° C., 140° C., and 130° C. The pellets were put into the extruder HP-50 (GANG LING MACHINERY CO., LTD.), pre-heated to 150° C. and maintained at 150° C. for 10 minutes, and then pressed at 150° C. by a pressure of 100 kg/cm$^2$ for 10 minutes to form a film as a light conversion layer.

The polypropylene resin EX6ES (commercially available from Japan Polypropylene Cooperation) was selected as a support layer material, put into the extruder HP-50 (commercially available from GANG LING MACHINERY CO., LTD.), pre-heated to 170° C. and maintained at 170° C. for 10 minutes, and then pressed at 170° C. by a pressure of 100 kg/cm$^2$ for 10 minutes to form a film as the support layer. The light conversion layer and the support layer were co-extruded to form a bi-layered sheet, and the physical properties of the sheet are listed in Table 1-1.

Example 4

100 kg of hydrogenated styrene elastomer resin S1611 (commercially available from Asahi Chemical Co. Ltd.) and 1 kg of the fluorescent molecule product in Synthesis Example 4 were put into the single-screw extruder to be pelletized as a light conversion layer material. The temperature of the extruder was separated to four segments: 130° C., 140° C., 140° C., and 130° C. The pellets were put into the extruder HP-50 (GANG LING MACHINERY CO., LTD.), pre-heated to 150° C. and maintained at 150° C. for 10 minutes, and then pressed at 150° C. by a pressure of 100 kg/cm$^2$ for 10 minutes to form a film as a light conversion layer.

The methyl methacrylate-styrene copolymer PM-600 (commercially available from Chi Mei Cooperation) was selected as a support layer material, put into the extruder HP-50 (commercially available from GANG LING MACHINERY CO., LTD.), pre-heated to 180° C. and maintained at 180° C. for 10 minutes, and then pressed at 180° C. by a pressure of 100 kg/cm$^2$ for 10 minutes to form a film as the support layer. The light conversion layer and the support layer were co-extruded to form a bi-layered sheet, and the physical properties of the sheet are listed in Table 1-1.

Example 5

100 kg of hydrogenated styrene elastomer resin S1611 (commercially available from Asahi Chemical Co. Ltd.) and 1 kg of the fluorescent molecule product in Synthesis Example 2 were put into the single-screw extruder to be pelletized as a light conversion layer material. The temperature of the extruder was separated to four segments: 130° C., 140° C., 140° C., and 130° C. The pellets were put into the extruder HP-50 (GANG LING MACHINERY CO., LTD.), pre-heated to 150° C. and maintained at 150° C. for 10 minutes, and then pressed at 150° C. by a pressure of 100 kg/cm$^2$ for 10 minutes to form a film as a light conversion layer.

The methyl methacrylate-styrene copolymer PM-600 (commercially available from Chi Mei Cooperation) was selected as a support layer material, put into the extruder HP-50 (commercially available from GANG LING MACHINERY CO., LTD.), pre-heated to 180° C. and maintained at 180° C. for 10 minutes, and then pressed at 180° C. by a pressure of 100 kg/cm$^2$ for 10 minutes to form a film as the support layer. The light conversion layer and the support layer were co-extruded to form a bi-layered sheet, and the physical properties of the sheet are listed in Table 1-2.

Example 6

100 kg of hydrogenated styrene elastomer resin S1611 (commercially available from Asahi Chemical Co. Ltd.) and 1 kg of the fluorescent molecule product in Synthesis Example 1 were put into the single-screw extruder to be pelletized as a light conversion layer material. The temperature of the extruder was separated to four segments: 130° C., 140° C., 140° C., and 130° C. The pellets were put into the extruder HP-50 (GANG LING MACHINERY CO., LTD.), pre-heated to 150° C. and maintained at 150° C. for 10 minutes, and then pressed at 150° C. by a pressure of 100 kg/cm$^2$ for 10 minutes to form a film as a light conversion layer.

The methyl methacrylate-styrene copolymer PM-600 (commercially available from Chi Mei Cooperation) was selected as a support layer material, put into the extruder HP-50 (commercially available from GANG LING MACHINERY CO., LTD.), pre-heated to 180° C. and maintained at 180° C. for 10 minutes, and then pressed at 180° C. by a pressure of 100 kg/cm$^2$ for 10 minutes to form a film as the support layer. The light conversion layer and the support layer were co-extruded to form a bi-layered sheet, and the physical properties of the sheet are listed in Table 1-2.

Example 7

100 kg of hydrogenated styrene elastomer resin S1611 (commercially available from Asahi Chemical Co. Ltd.) and 1 kg of the fluorescent molecule product in Synthesis Example 1 were put into the single-screw extruder to be pelletized as a light conversion layer material. The temperature of the extruder was separated to four segments: 130° C., 140° C., 140° C., and 130° C. The pellets were put into the extruder HP-50 (GANG LING MACHINERY CO., LTD.), pre-heated to 150° C. and maintained at 150° C. for 10 minutes, and then pressed at 150° C. by a pressure of 100 kg/cm$^2$ for 10 minutes to form a film as a light conversion layer.

Polyamide copolymer TROGAMID® CX7323 (commercially available from Evonik Company) was selected as a support layer material, put into the extruder HP-50 (commercially available from GANG LING MACHINERY CO., LTD.), pre-heated to 260° C. and maintained at 260° C. for 5 minutes, and then pressed at 260° C. by a pressure of 100 kg/cm² for 10 minutes to form a film as the support layer. The light conversion layer and the support layer were co-extruded to form a bi-layered sheet, and the physical properties of the sheet are listed in Table 1-2.

Comparative Example 1

The hydrogenated styrene elastomer resin S1611 (commercially available from Asahi Chemical Co. Ltd.) was put into the extruder HP-50 (GANG LING MACHINERY CO., LTD.), pre-heated to 150° C. and maintained at 150° C. for 10 minutes, and then pressed at 150° C. by a pressure of 100 kg/cm² for 10 minutes to form a film as a support layer.

Acrylic acid block copolymer 2140e (commercially available from Kuraray) was put into the extruder HP-50 (GANG LING MACHINERY CO., LTD.), pre-heated to 150° C. and maintained at 150° C. for 10 minutes, and then pressed at 150° C. by a pressure of 100 kg/cm² for 10 minutes to form a film as a support layer.

Poly(methyl methacrylate) CM211 (commercially available from Chi Mei Cooperation) was put into the extruder HP-50 (GANG LING MACHINERY CO., LTD.), pre-heated to 180° C. and maintained at 180° C. for 10 minutes, and then pressed at 180° C. by a pressure of 100 kg/cm² for 10 minutes to form a film as a support layer. The support layers (S1611+2140e+CM211) were co-extruded to form a tri-layered sheet, and the physical properties of the sheet are listed in Table 1-2.

TABLE 1-1

|  | Example 1 | Example 2 | Example 3 | Example 4 |
|---|---|---|---|---|
| Composition | Fluorescent molecule + S1611/ PM-600 | Fluorescent molecule + S1611/ PM-600 | Fluorescent molecule + S1611/ EX6ES | Fluorescent molecule + S1611/ PM-600 |
| Thickness | 303 μm/ 212 μm | 320 μm/ 211 μm | 312 μm/ 205 μm | 305 μm/ 212 μm |
| Water permeability (g/m² · day) | 2.7 ± 0.3 | 2.7 ± 0.2 | 0.2 ± 0.1 | 2.8 ± 0.3 |
| Light transmittance (%) | 90.2 ± 0.1 | 89.8 ± 0.1 | 90.1 ± 0.1 | 90.4 ± 0.1 |
| Haze | 5.7 ± 0.2 | 4.9 ± 0.3 | 21.2 ± 0.9 | 3.7 ± 0.3 |

TABLE 1-2

|  | Example 5 | Example 6 | Example 7 | Comparative Example 1 |
|---|---|---|---|---|
| Composition | Fluorescent molecule + S1611/ PM-600 | Fluorescent molecule + S1611/ PM-600 | Fluorescent molecule + S1611/ CX7323 | S1611/ 2140e/ CM211 |
| Thickness | 307 μm/ 212 μm | 306 μm/ 212 μm | 308 μm/ 212 μm | 312 μm/ 126 μm/ 195 μm |
| Water permeability (g/m² · day) | 2.6 ± 0.3 | 2.5 ± 0.3 | 2.8 ± 0.3 | 2.8 ± 0.2 |
| Light transmittance (%) | 90.6 ± 0.1 | 90.4 ± 0.1 | 90.0 ± 0.1 | 87.9 ± 0.1 |
| Haze | 4.4 ± 0.3 | 4.1 ± 0.2 | 4.1 ± 0.3 | 37.6 ± 1.1 |

In Tables 1-1 and 1-2, the thickness was measured by a thickness gauge, the water permeability was measured by ASTM F-1249 standard, the light transmittance was measured by ASTM D1003 standard, and the haze was measured by ASTM D1003 standard.

Comparative Example 2

The hydrogenated styrene elastomer resin S1611 (commercially available from Asahi Chemical Co. Ltd.) was put into the extruder HP-50 (GANG LING MACHINERY CO., LTD.), pre-heated to 150° C. and maintained at 150° C. for 10 minutes, and then pressed at 150° C. by a pressure of 100 kg/cm² for 10 minutes to form a film as a support layer.

The methyl methacrylate-styrene copolymer PM-600 (commercially available from Chi Mei Cooperation) was put into the extruder HP-50 (GANG LING MACHINERY CO., LTD.), pre-heated to 180° C. and maintained at 180° C. for 10 minutes, and then pressed at 180° C. by a pressure of 100 kg/cm² for 10 minutes to form a film as a support layer. The support layers (S1611+PM-600) were co-extruded to form a bi-layered sheet.

Comparative Example 3

The hydrogenated styrene elastomer resin S1611 (commercially available from Asahi Chemical Co. Ltd.) was put into the extruder HP-50 (GANG LING MACHINERY CO., LTD.), pre-heated to 150° C. and maintained at 150° C. for 10 minutes, and then pressed at 150° C. by a pressure of 100 kg/cm² for 10 minutes to form a film as a support layer.

The acrylic acid block copolymer 2140e (commercially available from Kuraray) was put into the extruder HP-50 (GANG LING MACHINERY CO., LTD.), pre-heated to 150° C. and maintained at 150° C. for 10 minutes, and then pressed at 150° C. by a pressure of 100 kg/cm² for 10 minutes to form a film as a support layer.

The methyl methacrylate-styrene copolymer PM-600 (commercially available from Chi Mei Cooperation) was put into the extruder HP-50 (GANG LING MACHINERY CO., LTD.), pre-heated to 180° C. and maintained at 180° C. for 10 minutes, and then pressed at 180° C. by a pressure of 100 kg/cm² for 10 minutes to form a film as a support layer. The support layers (S1611+2140e+PM-600) were co-extruded to form a tri-layered sheet.

Comparison of Electrical Properties

The maximum output power of bifacial solar cells (commercially available from Motech Industries, Inc.) was measured. A front side and a back side of the bifacial solar cells were then encapsulated by encapsulation films of EVA with a thickness of 0.6 mm, respectively. The sheets of Examples 1 to 7 and Comparative Examples 1 to 4 and commercially available fluorinated transparent sheet (KOBATECH-PV see through type 3) were disposed on two sides of the encapsulation films, and then put into a vacuum laminator to be thermally laminated for completing the packaging structures. The maximum output power, short circuit current, and open circuit voltage of the packaging structures were measured. The maximum output power of the original bifacial solar cells and packaging structures in different Examples and Comparative Examples are listed in Table 2.

TABLE 2

|  | Maximum output power of the solar cell | Maximum output power of the package structure | Efficiency enhancement (%) |
|---|---|---|---|
| Example 1 | 4.321 | 4.470 | 3.477 |
| Example 2 | 4.325 | 4.493 | 3.884 |
| Example 3 | 4.314 | 4.476 | 3.755 |
| Example 4 | 4.314 | 4.493 | 4.145 |
| Example 5 | 3.703 | 3.862 | 4.297 |
| Example 6 | 3.689 | 3.866 | 4.789 |

TABLE 2-continued

| | Maximum output power of the solar cell | Maximum output power of the package structure | Efficiency enhancement (%) |
|---|---|---|---|
| Example 7 | 3.762 | 3.955 | 5.113 |
| Comparative Example 1 | 4.328 | 4.374 | 1.069 |
| Comparative Example 2 | 4.342 | 4.396 | 1.251 |
| Comparative Example 3 | 4.406 | 4.434 | 0.638 |
| Fluorinated sheet | 4.263 | 4.355 | 2.176 |

In Table 2, the maximum power was measured by IEC60891 standard, the short circuit current was measured by IEC60891 standard, and the open circuit voltage was measured by IEC60891 standard.

It will be apparent to those skilled in the art that various modifications and variations can be made to the disclosed methods and materials. It is intended that the specification and examples be considered as exemplary only, with the true scope of the disclosure being indicated by the following claims and their equivalents.

What is claimed is:

1. A sheet, comprising:
a support layer; and
a light conversion layer disposed on the support layer, wherein the light conversion layer includes a fluorescent molecule and a hydrogenated styrene elastomer resin,
wherein the fluorescent molecule has a structure of:

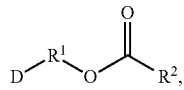

wherein D is anthranyl, carbazolyl, or pyrenyl;
$R^1$ is $C_{1-4}$ alkylene group; and
$R^2$ is $C_{12-18}$ alkyl group.

2. The sheet as claimed in claim 1, wherein the hydrogenated styrene elastomer resin comprises hydrogenated poly(styrene-b-isoprene), hydrogenated poly(styrene-b-isoprene-b-styrene), hydrogenated poly(styrene-b-butadiene-b-styrene), hydrogenated poly(styrene-b-isoprene/butadiene-b-styrene, hydrogenated poly(styrene-b-vinyl bonded rich polyisoprene), or a combination thereof.

3. The sheet as claimed in claim 2, wherein the hydrogenated styrene elastomer resin layer contains 10 wt % to 35 wt % of a polystyrene block.

4. The sheet as claimed in claim 1, wherein the support layer comprises polyolefin, glass, or polyamide.

5. The sheet as claimed in claim 4, wherein the polyolefin comprises linear olefin polymer or cyclic olefin polymer.

6. The sheet as claimed in claim 5, wherein the linear olefin polymer includes polyethylene, polypropylene, ethylene-propylene copolymer, or methyl methacrylate-styrene copolymer, and the cyclic olefin polymer includes ethylene propylene diene monomer rubber.

7. The sheet as claimed in claim 1, wherein the fluorescent molecule and the hydrogenated styrene elastomer resin in the light conversion layer have a weight ratio of 1:199 to 1:4.

8. The sheet as claimed in claim 1, having a thickness of 0.3 mm to 1 mm, and the light conversion layer and the support layer have a thickness ratio of 1:1 to 1:10.

9. A module structure, comprising:
a front sheet;
a back sheet opposite the front sheet;
a solar cell disposed between the front sheet and the back sheet;
a first encapsulating film disposed between the solar cell and the front sheet; and
a second encapsulating film disposed between the solar cell and the back sheet,
wherein one or both of the front sheet and the back sheet is the sheet as claimed in claim 1, and the light conversion layer is disposed between the support layer and the solar cell.

10. The module structure as claimed in claim 9, wherein the first encapsulating film and the second encapsulating film comprise ethylene vinyl acetate.

11. The module structure as claimed in claim 9, wherein the solar cell includes a bifacial solar cell.

* * * * *